United States Patent [19]

Froloff et al.

[11] 4,005,454
[45] Jan. 25, 1977

[54] SEMICONDUCTOR DEVICE HAVING A SOLDERABLE CONTACTING COATING ON ITS OPPOSITE SURFACES

[75] Inventors: Helmut Froloff, Schwabach; Theodor Tovar, Bubenreuth, both of Germany

[73] Assignee: Semikron Gesellschaft fur Gleichrichterbau und Elektronik m.b.H., Nurnbeg, Germany

[22] Filed: Mar. 26, 1976

[21] Appl. No.: 670,826

[30] Foreign Application Priority Data

Apr. 5, 1975 Germany .................. 2514922

[52] U.S. Cl. .................. 357/65; 357/67; 357/68; 29/588; 29/589; 29/590
[51] Int. Cl.² .................. H01L 23/48; H01L 29/40; H01L 29/46; H01L 29/62
[58] Field of Search .......... 357/65, 67, 68; 29/588, 29/589, 590

[56] References Cited

UNITED STATES PATENTS

| | | | |
|---|---|---|---|
| 3,046,651 | 7/1962 | Olmon et al. .................. | 357/65 |
| 3,137,595 | 6/1964 | Datalong .................. | 357/65 |
| 3,414,969 | 12/1968 | Blum et al. .................. | 357/65 |
| 3,429,040 | 2/1969 | Miller .................. | 357/65 |
| 3,584,265 | 6/1971 | Nier .................. | 357/65 |
| 3,680,196 | 8/1972 | Leinkram .................. | 357/65 |
| 3,930,306 | 1/1976 | Goldberg et al. .................. | 357/65 |

*Primary Examiner*—Andrew J. James
*Attorney, Agent, or Firm*—Spencer & Kaye

[57] ABSTRACT

A semiconductor device which is resistant against alternating thermal stresses in which a disc of semiconductor material, which is provided with at least one pn-junction and with solderable contacting coatings on its opposite major surfaces, has these coatings permanently connected, in a direct planar manner, with current conducting connections by means of a soft solder. The soft solders employed are tin solders containing 3 to 8% antimony, 0.1 to 2% nickel, remainder tin, or 3 to 8% antimony, 0.1 to 3% copper, 0.1 to 2% cadmium, remainder tin, or 1 to 6% silver, 0.1 to 2% cadmium, remainder tin; cadmium solders containing 10 to 25% zinc, 1 to 5% silver, remainder cadmium, or 10 to 25% zinc, 5% silver, 3% copper, remainder cadmium; zinc solders containing 10 to 25% cadmium, 0.1 to 3% copper, remainder zinc; and lead solders containing 10 to 20% cadmium, 0.3 to 5% antimony, remainder lead, or 1 to 5% silver, 0.5 to 2% tin, 0.1 to 2% nickel, 0.1 to 3% copper, remainder lead.

5 Claims, 1 Drawing Figure

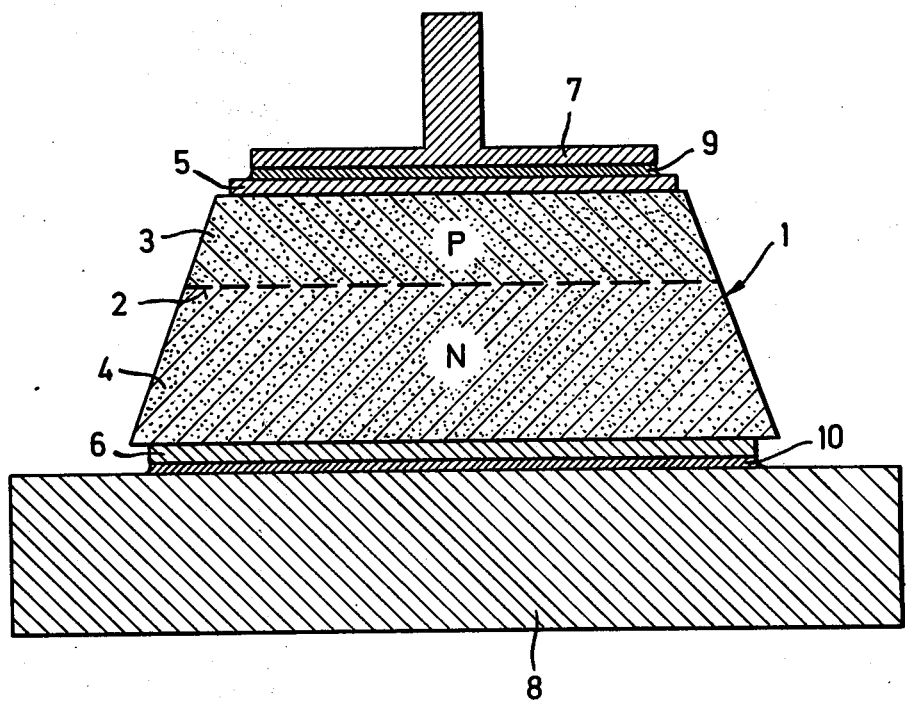

SEMICONDUCTOR DEVICE HAVING A SOLDERABLE CONTACTING COATING ON ITS OPPOSITE SURFACES

BACKGROUND OF THE INVENTION

The present invention relates to a semiconductor device which is resistant to alternating thermal stresses and in which a semiconductor wafer, which is provided with at least one pn-junction and with solderable contacting coatings on its opposite surfaces, is permanently connected by means of a soft solder in direct planar contact with the current conducting terminals.

Semiconductor devices are known, such as rectifier elements or transistors, in which the semiconductor wafer, which has been pretreated in a diffusion process, is provided with nickel coatings on both major surfaces and with at least one further metal layer which enhances the soft soldering process, and this wafer is contacted by soft soldering these contacting coatings with housing portions and/or with connecting conductor parts, which are preferably made of copper, and is disposed in a housing. Solders on a basis of tin or lead with the addition of silver, indium, bismuth or antimony are provided as soft solders. Such soft solders, for example, are solders consisting of about 96% tin, about 4% silver and small proportions of bismuth or antimony, or of 92.5% lead with the remainder being tin and silver, or of 99% lead and 1% tin. As has been shown in tests, however, semiconductor devices for medium and high current carrying capabilities with contacting layers of such solders are not capable of withstanding use under stress with frequent changes in operating temperature since these extreme stresses cause the soft solder layers to exhibit fatigue after a certain period of time, which fatigue leads to the connecting conductor parts coming loose and thus cause the device to fail.

The difficulties encountered with such use of the above-mentioned devices when they are provided with soft solder contacts arise from the fact that the soft solders have significant physical property values, particularly their thermal expansion coefficient, their electrical and thermal conductivity and their tensile strength and yield strength, which deviate substantially from the corresponding values of the materials of the adjacent components.

Various proposals for solutions have been made to overcome these difficulties. Embodiments of semiconductor devices are known in which at least one disc of a high melting point metal, preferably tungsten or molybdenum, is hard soldered to the contacting surface of each of the metallic contact components which are intended to be connected with the semiconductor wafer, and the semiconductor wafer is fastened between these metal discs by means of a soft solder, so that the soft solder layer comes to lie between materials which have approximately the same coefficient of thermal expansion.

In other known embodiments such metal discs consist of layers of different materials, i.e., a layer of tungsten or molybdenum faces the semiconductor wafer and a layer of copper or silver faces toward the connecting conductor so that the coefficients of thermal expansion of adjacent materials approximately coincide. These metal discs are permanently connected, by means of soft solder, with the semiconductor wafer as well as with the connecting conductor parts.

Such known arrangements exhibit better resistances to alternating temperatures than arrangements without the above-mentioned metal discs. However, they have the significant drawbacks of high electrical and thermal resistance due to the thickness of the metal discs, which is considerable compared to the thickness of the soft solder layers, and of the need for considerable expenditures for the metals and the additionally required process steps. Furthermore the sintered discs developed in this connection, which discs comprise a plurality of metals, are expensive to manufacture and must be properly pretreated in order to be suitable for further processing.

Semiconductor devices with hard solder contacts are also known where such hard solder contacts are disposed between the semiconductor wafer, the metal disc and/or the connecting conductor. With such a structure the desired resistance to alternating temperatures is provided. However, under the high process temperatures required for the hard soldering process, undesirable reactions of the provided metals with the semiconductor material often substantially worsens the properties of the semiconductor material.

Semiconductor arrangements with high resistance to alternating temperature stresses are known in which semiconductor wafers are connected directly with connecting terminals in a planar manner to form conductive connections. For this purpose soft solders are used which have a lead or tin base and each contain small quantities of silver, copper or antimony. The resistance to alternating temperatures, however, is attained in these arrangements in that up to 50% of a high melting point metal in powder form is mixed with the soft solder and this metal will dissolve in the soft solder only incompletely or not at all at the soldering temperature required for the soft solder. The soft solder itself thus does not have the special property of being resistant to alternating temperature stresses and the substantial increase in surface area of the solder material produced by the addition of the metal powder results in a disadvantageous increase of the thermal transfer resistances of the soft solder layer.

Moreover eutectic gold/tin solders are also known which, as low melting point solders, do have the desired resistance to changes in temperature but which, due to their high gold content, constitute an undesirable cost factor in the assembly of semiconductor devices.

SUMMARY OF THE INVENTION

It is therefore the object of the present invention to find soft solders which are suitable for the direct connection of semiconductor wafers with the current conducting terminals in semiconductor devices which are intended for use under alternating temperature stresses.

Experiments have shown that this can be surprisingly and advantageously accomplished with soft solders made of known alloys of zinc and cadmium, but with the respective addition of copper and/or silver, and with known alloys of lead, silver and tin, with the addition of copper and nickel. Furthermore, known soft solders of tin, nickel and antimony, of tin, antimony, copper and cadmium, of tin, silver and cadmium, and of lead, cadmium and antimony, where, in each case, the range of the alloy component, which in the known solders is contained in small quantities, is in part expanded to a substantial extent have surprisingly been found to be suitable.

According to the present invention the solution of the problem for semiconductor devices of the above-mentioned type is achieved in that the soft solders utilized are tin solders consisting of 3 to 8% antimony, 0.1 to 2% nickel, remainder tin, or 3 to 8% antimony, 0.1 to 3% copper, 0.1 to 2% cadmium, remainder tin, or 1 to 6% silver, 0.1 to 2% cadmium, remainder tin; cadmium solders with 10 to 25% zinc, 1 to 5% silver, remainder cadmium, or 10 to 25% zinc, 5% silver, 3% copper, remainder cadmium; zinc solders with 10 to 25% cadmium, 0.1 to 3% copper, remainder zinc; and lead solders with 10 to 20% cadmium, 0.3 to 5% antimony, remainder lead, or 1 to 5% silver, 0.5 to 2% tin, 0.1 to 2% nickel, 0.1 to 3% copper, remainder lead.

BRIEF DESCRIPTION OF THE DRAWINGS

The FIGURE is an elevational view of a semiconductor device according to the invention.

DETAILED DESCRIPTION OF THE PREFERRED EMBODIMENT

Referring now to the FIGURE, there is shown a semiconductor device of the type to which the present invention is directed and which except for the particular type of soft solder employed, is well known in the art. The semiconductor device basically includes a disc or wafer 1 of semiconductor material, e.g., silicon, which contains at least pn-junction 2 formed by adjacent semiconductor regions 3 and 4 of opposite conductivity types. The opposite major surfaces of the semiconductor wafer 1 are provided with solderable metal contact layers 5 and 6, for example, nickel. These solderable metal contact layers 5 and 6 are, as shown directly connected along their planar outer surfaces with current conducting connections or electrodes 7 and 8 respectively via layers of soft solder 9 and 10 respectively.

According to the invention, in order to provide a semiconductor device, e.g., the rectifier shown, which is resistant to the alternating thermal stresses produced during operation of the device (particularly for high power devices), instead of the soft solders previously used for such bonding purposes in semiconductor devices, the soft solder layers 9 and 10 are formed of one of the following solders:

tin solders containing 3 to 8% antimony, 0.1 to 2% nickel, remainder tin, or 3 to 8% antimony, 0.1 to 3% copper, 0.1 to 2% cadmium, remainder tin, or 1 to 6% silver, 0.1 to 2% cadmium, remainder tin;
cadmium solders containing 10 to 25% zinc, 1 to 5% silver, remainder cadmium, or 10 to 25% zinc, 5% silver, 3% copper, remainder cadmium;
zinc solders containing 10 to 25% cadmium, 0.1 to 3% copper, remainder zinc; or,
lead solders containing 10 to 20% cadmium, 0.3 to 5% antimony, remainder lead, or 1 to 5% silver, 0.5 to 2% tin, 0.1 to 2% nickel, 0.1 to 3% copper, remainder lead. It is understood that the above percentages of the components of the soft solders are by weight.

The solders according to the present invention exhibit good wetting and spreading properties on the surfaces of the components in question which are intended to be connected together by soft soldering, and which have been suitably pretreated if required. Tests have shown that an undesirable influence of the alloy components zinc and cadmium on the flow capability and adhesion, as it is known from the soft soldering art, is not noted in the manufacture of semiconductor devices with solders according to the present invention and thus cannot have a disadvantageous effect on the assembly and operating behavior of the devices.

An explanation of the advantageous values of creep resistance, the elasticity constant, and tensile strength is found in the internal tensions of the crystal lattice due to the incorporation of different size atoms as it takes place with an alloying addition of certain metals, particularly to the base metals lead and tin.

The use of the particular one of the soft solders according to the invention, i.e., their use to connect components, is determined by the properties of the latter. Thus, for example, solders with a higher electrical conductivity, i.e., preferably soft solders containing zinc and cadmium as the alloy components, are used at points of higher current densities.

The solders may be provided in the form of foils and/or soldering discs. Their thickness is determined by the fact that the resulting contacting layers must have a thickness of at least 20μ.

The contacting process can take place, for example, in such a manner that the respective components are stacked with a solder disc therebetween and are then soldered together in a continuous heat furnace.

The advantages of the soft solders according to the invention are that adjacent components made of materials having different coefficients of thermal expansion can be connected together in a simple process, which per se is known for the use of soft solders, in semiconductor devices for medium and higher current carrying capability, so that in many cases expensive hard solder connections are eliminated, and furthermore so that contacting discs of high melting point material can be avoided so that there results particularly economical structures of semiconductor devices which can be used for extreme stresses.

It will be understood that the above description of the present invention is susceptible to various modifications, changes and adaptations, and the same are intended to be comprehended within the meaning and range of equivalents of the appended claims.

What is claimed is:

1. In a semiconductor device including a disc of semiconductor material having at least one pn-junction and solderable contacting coatings on its opposed major surface which coatings are permanently connected in a direct planar manner with respective current conducting connections by means of a soft solder; the improvement wherein said soft solder is a tin solder containing 3 to 8% antimony, 0.1 to 2% nickel, remainder tin, or 3 to 8% antimony, 0.1 to 3% copper, 0.1 to 2% cadmium, remainder tin, or 1 to 6% silver, 0.1 to 2% cadmium, remainder tin; or a cadmium solder containing 10 to 25% zinc, 1 to 5% silver, remainder cadmium, or 10 to 25% zinc, 5% silver, 3% copper, remainder cadmium; or a zinc solder containing 10 to 25% cadmium, 0.1 to 3% copper, remainder zinc; or a lead solder containing 10 to 20% cadmium, 0.3 to 5% antimony, remainder lead, or 1 to 5% silver, 0.5 to 2% tin, 0.1 to 2% nickel, 0.1 to 3% copper, remainder lead, whereby a semiconductor device which is resistant against alternating thermal stresses is obtained.

2. A semiconductor device as defined in claim 1 wherein said soft solder is one of said tin solders.

3. A semiconductor device as defined in claim 1 wherein said soft solder is one of said cadmium solders.

4. A semiconductor device as defined in claim 1 wherein said soft solder is one of said zinc solders.

5. A semiconductor device as defined in claim 1 wherein said soft solder is one of said lead solders.

* * * * *